United States Patent
Batten, Jr. et al.

[11] Patent Number: 6,094,361
[45] Date of Patent: Jul. 25, 2000

[54] ASSEMBLIES OF PRINTED CIRCUIT BOARDS AND FLEXIBLE CONTAINERS THEREFOR

[75] Inventors: L. Eugene Batten, Jr., Angier; Dennis A. McCulloch, Chapel Hill; John Kim, Durham, all of N.C.

[73] Assignee: Nortel Networks Corporation, Montreal, Canada

[21] Appl. No.: 08/989,829

[22] Filed: Dec. 12, 1997

[51] Int. Cl.[7] .................................................. H05K 9/00
[52] U.S. Cl. ..................... 361/816; 361/656; 361/800; 361/799; 361/816; 361/818; 174/35 R; 174/35 GC
[58] Field of Search ..................... 361/656, 818, 361/816, 800, 799; 174/35 R, 35 GC

[56] References Cited

U.S. PATENT DOCUMENTS

| | | | |
|---|---|---|---|
| 5,436,803 | 7/1995 | Amis et al. | 361/818 |
| 5,527,989 | 6/1996 | Leeb | 174/35 GC |
| 5,545,494 | 8/1996 | Trumble et al. | 429/163 |
| 5,739,463 | 4/1998 | Diaz et al. | 174/35 R |

*Primary Examiner*—Leo P. Picard
*Assistant Examiner*—Tuan Dinh
*Attorney, Agent, or Firm*—Foley & Lardner

[57] ABSTRACT

For economic, space-saving and simplicity in design, an assembly is provided of a printed circuit board and flexible container in which the board has an electrical connector mounted upon it, and the printed board and connector are positioned wholly within the container. The container is electrically connected to another connector exteriorly of the container by terminal pins extending through the container. Preferably the terminal pins extend through individual holes formed through the container by the force of the pins during engagement of the connectors. The pins are electrically isolated from an EMI protection layer in the container wall, but other pins may actually contact the EMI protection layer to provide a ground. A method of assembly is also described and, in addition, a mounting for a plurality of the assemblies.

32 Claims, 8 Drawing Sheets

ASSEMBLIES OF PRINTED CIRCUIT BOARDS AND FLEXIBLE CONTAINERS THEREFOR

This invention relates to printed circuit boards having flexible containers.

In the electronics industry, printed circuit boards are conventionally incorporated into equipment. Dependent upon the usage of the printed circuit boards, it may be required to prevent electromagnetic radiation from passing to or from surface mount components mounted upon the boards because of the electromagnetic interference (EMI) which results. Up to the present time, it has been conventional practise to provide EMI shielding around an entire printed circuit board by housing the printed circuit board within a conductive rigid metal shield forming part of an assembly with the printed circuit board. The metal shield is grounded to provide the required EMI protection. An electrical connector is necessary to connect the printed circuit board with electrical equipment or a power source exteriorly of the shield. Conventional arrangements have proved to be unsatisfactorily expensive, occupy an inordinately large spacial volume as compared to the volume of the printed circuit board and its mounted components, and require many manufacturing steps.

In an effort to overcome the above problems, a U.S. Pat. No. 5,545,494 to W. P. Trumble et al describes an assembly of printed circuit board and a flexible container around the board and in which EMI protection is provided by a conductive flexible metal layer as an inner layer of the container wall. The container has an opening within which a connector of the board is mounted with the opening to the container being sealed around a peripheral surface of the body of the connector. Not only is EMI protection provided, but also the inside of the container and thus the printed circuit board and its surface mounted components are protected from dust or any other airborne contamination. A problem with the structure described in the above patent is that the connector body needs to be sufficiently large in size for the container to seal around it at the container opening. A body of this size is much larger than would otherwise be necessary merely to be mounted upon a printed circuit board for conveying signals to and from the board. The structure is therefore cumbersome.

The present invention seeks to provide a solution to the above problems while providing for an assembly of printed circuit board and flexible container in which a connector body mounted upon the board may be of a size more in keeping with the size of connector required solely for transmission of signals.

According to one aspect of the present invention, there is provided an assembly of a printed circuit board and a flexible container comprising: a printed circuit board having a first electrical connector electrically connected thereto; a flexible container defining a chamber within the container, the chamber containing both the printed circuit board and the first electrical connector, the flexible container having a laminate construction wall and comprising a dielectric layer facing inwardly into the chamber and an EMI protection layer surrounding the dielectric layer; and a second electrical connector mounted exteriorly of and upon a wall of the container, one of the connectors having electrical conductor terminal pins which extend through the wall of the container and electrically connect the first and second connectors together with at least selected ones of the conductor pins being signal pins which are electrically isolated from the EMI protection layer.

With the above invention, structures have the first connector contained wholly within the flexible container and sealing of the container around a periphery of such connectors is avoided. Hence the first connectors may be of sufficient size solely for the purpose of transmitting signals to and from the printed circuit board thereby reducing the overall size of the assembly of board and first connector to one which is comparable to a conventional assembly of board and connector. The invention thus provides an arrangement in which the printed circuit board and the first connector are electrically connected to other elements outside the container by passage of the electrical conductor terminal pins through the container itself, these pins being part of either the first or second connector. For ease of assembly the electrical conductor terminal pins are preferably part of the second connector which is connected to the first connector through the flexible container by aligning the two connectors with the first connector located inside the container, and then passing the conductor pins through the wall of the container for electrical connection purposes. For this purpose, there may be a preformed hole in the wall of the container for passage of all of the pins, but preferably no preformed hole is provided. In the preferred arrangement, each of the pins forms its own individual hole through the container by passage of the pin through the hole so that piercing of the container is required during the electrical connection of the two connectors. Thus with this arrangement having individual holes, each signal conductor terminal pin requires its own electrical isolation from the EMI protection layer and this isolation is provided by an individual dielectric layer surrounding each of the signal pins and which separates each signal pin from the EMI protection layer. The individual dielectric layer is formed by a molding or coating process.

With the above construction, all of the pins may be signal pins so that they all are insulated from the EMI protection layer, but at least one pin may be a grounding pin. In the case of a grounding pin, no dielectric insulation is required round the pin because this pin needs to be in electrical contact with the EMI protection layer so as to ground it. This electrical contact is formed as the assembly is being made and during the passage of the electrical conductor terminal pins through the wall of the container.

Constructions according to the invention defined above may have spaced apart apertures provided in the container for the circulation of cooling air into and out of the chamber. In such a case the spacing and sizes of the apertures have limits which are consistent with those required to substantially prevent electromagnetic radiation passing through the container. However, in further preferred constructions, where cooling air circulation is not a requirement, then no apertures are provided within the container and the chamber is hermetically sealed within the container. With this preferred arrangement, it is necessary for the second electrical connector to be also sealed against the container by an endless seal which encircles the plurality of electrical conductor pins. Such a seal may be provided either by a compressible sealing member between the second electrical connector and an outside surface of the container or by a suitable sealing adhesive.

In the assembly of the invention defined above, it may be preferable to have a fastening device which holds the first and second connectors assembled together through the wall of the container. Such a fastening device is to be preferred where the second connector is sealed against the container as the device will urge the second connector towards the container to maintain the sealing arrangement with the container.

The invention also includes a method of forming an assembly of a printed circuit board and a flexible container comprising: providing a sub-assembly of a printed circuit board with a first electrical connector mounted thereon, and passing the sub-assembly through an opening in a flexible container to contain the sub-assembly wholly within a chamber defined by the flexible container, the opening in the container being subsequently closed, and the flexible container having a laminate construction wall comprising a dielectric layer facing inwardly into the chamber and an EMI protection layer surrounding the dielectric layer; providing a second electrical connector exteriorly of the container and relatively positioning the sub-assembly and the second electrical connector to locate electrical terminals of the second connector aligned with electrical terminals of the first connector; and electrically connecting together the two connectors by passing electrical conductor terminal pins of one of the connectors through the wall of the container and into electrical contact with terminal sockets of the other connector with at least selected ones of the terminal pins being signal pins which, during electrically connecting the two connectors together, are electrically isolated from the EMI protection layer.

The invention further includes, in combination, an assembly of a printed circuit board, a flexible container for the printed circuit board, and a carrier for the assembly, wherein the combination comprises: a printed circuit board having a first electrical connector electrically connected thereto; a flexible container defining a chamber within the container, the chamber containing both the printed circuit board and the first electrical connector, the flexible container having a laminate construction wall and comprising a dielectric layer facing inwardly into the chamber and an EMI protection layer surrounding the dielectric layer; a second electrical connector mounted exteriorly of and upon a wall of the container, one of the connectors having electrical conductor terminal pins which extend through the wall of the container to electrically connect the first and second connectors together with at least selected ones of the conductor terminal pins being signal pins which are electrically isolated from the EMI protection layer, the container also being provided with at least one mounting means extending through the container in a marginal region of the container laterally of the printed circuit board; and the carrier comprises a mounting member having a mounting shaft extending from the mounting member, the mounting shaft being capable of being passed through an aperture of the mounting means to mount the assembly upon the carrier.

According to yet a further aspect of the invention there is provided an electrical connector comprising a dielectric housing, a plurality of electrical conductor terminals carried by the housing, the plurality of electrical conductor terminals comprising electrical conductor terminal pins extending from the housing, and at least some of the pins having an electrical insulation layer extending around an axial length of each pin with a free end portion of the pin extending outwardly beyond its insulation layer.

Embodiments of the invention will now be described, by way of example, with reference to the accompanying drawings, in which.

Figure 1:
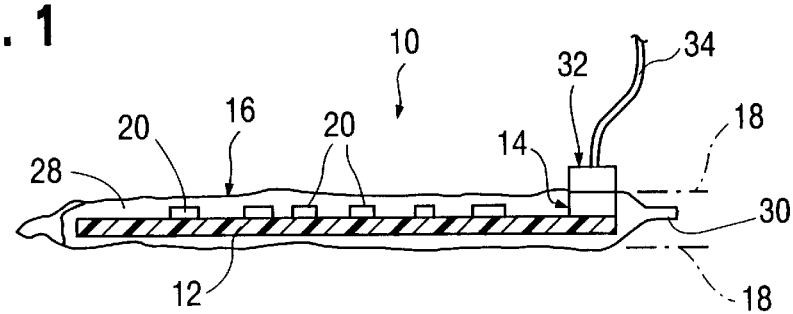
FIG. 1 is a side elevational diagrammatic view in cross-section of an assembly of printed circuit board and flexible container according to a first embodiment.

In a first embodiment as shown in FIG. 1, an assembly 10 of a printed circuit board and flexible container comprises a printed circuit board 12 of conventional construction, the printed circuit board having an elongate electrical connector 14 mounted along one edge region of the board. The connector 14 is electrically connected into circuitry of the board in conventional manner.

Figure 3:
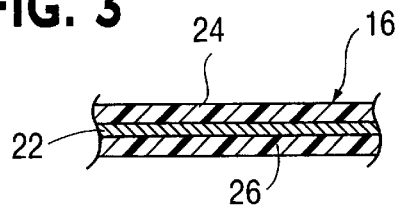
FIG. 3 is a cross-sectional view through a wall of the container of the first embodiment and to larger scale.

A flexible container 16 of the assembly is manufactured with an open end 18 shown in chaindotted in FIG. 1 and into which the printed circuit board 12 and accompanying connector 14 have been inserted as a sub-assembly. The container 16 is of laminate construction wall and requires an EMI Protection layer for the purpose of preventing or of substantially diminishing the amount of electromagnetic radiation penetrating the container either to or from surface mount components 20 mounted upon the printed circuit board. For this, as shown by FIG. 3, a thin metal layer 22 (e.g. copper or other suitable conductive material) is provided intermediate inner and outer layers of the container. The layer 22 may be of any desired thickness while being suitable for its desired purpose. It is found that a thickness down to 0.5 mil will suffice. The layer 22 is also imperforate and thus also serves as a moisture or other fluid barrier through the wall of the container. Alternatively, the layer 22 is perforate while still satisfying its EMI protection requirements, and a specific moisture impermeable layer (not shown) is then included in the container. This specific layer may, for instance, be made from polyvinylidene chloride (such as sold under the trade name "Saran"). The outer layer 24 is required to provide strength to the container and also to have abrasion and cutting resistance. In addition it should also have dielectric properties. Any suitable polymeric material may do for this purpose, e.g. polyethylene terephthalate possibly sold under the trade name "Mylar". Other materials are also suitable including polypropylene or polyamide. The outer layer is of a desired thickness to provide required flexibility. A thickness of at least 1 mil is found suitable.

The inner layer 26 which faces inwardly into a chamber 28 (FIG. 1) within the container, needs also to be of dielectric material (basically to prevent shorting of circuitry on the printed circuit board should the cover contact any surface of the board or any electrical conductor carried by the board). With the particular requirements of the container, it is also necessary for the material of the inner layer to be such that it will fuse and heat seal to itself.

Figure 2:
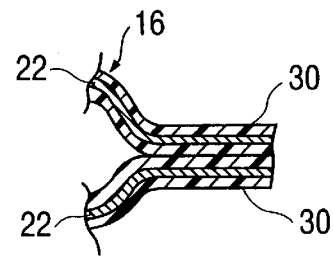
FIG. 2 is a cross-sectional view of a sealed opening of the container of FIG. 1 and to a larger scale.

A suitable material and as used in this embodiment is polyethylene. As shown by FIGS. 1 and 2, marginal edge regions 30 of the container 16 at the open end 18 have been brought together with inside surfaces provided by the polyethylene inner layer 26 abutted and then heat sealed together. A thermal seal along the fused together marginal edge regions 30 is thus provided thereby thermally insulating a chamber 28 within the container from the outside environment.

Figure 4:
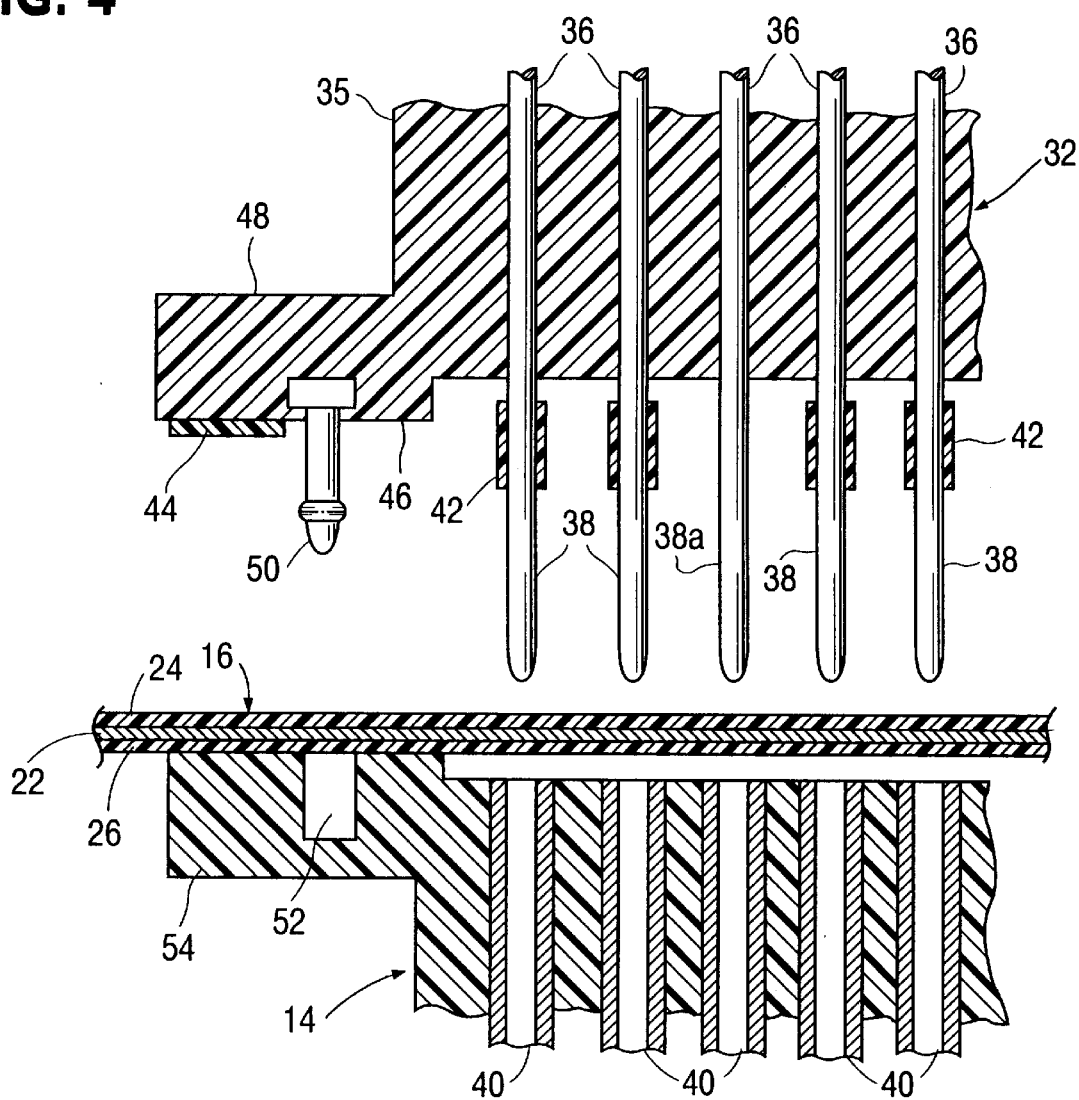
FIG. 4 is a large scale cross-sectional view through two connectors of the assembly of the first embodiment and showing a first stage in the completion of the assembly.

The printed circuit board 12 communicates electrically with equipment exteriorly of the container 16 by means of another elongate connector 32 which is a mating connector for the connector 14. The connector 32 (FIG. 1) has insulated electrical conductors 34 extending therefrom for connection to other equipment or to other printed circuit boards as required. The connector 32 is shown in detail in FIG. 4. The connector 32 comprises a dielectric housing 35 having conductor terminals 36 carried by the housing, the terminals 36 being connected at one side in conventional manner to the conductors 34. The other side of the terminals 36 extend as electrical conductor terminal pins 38 for electrical interconnection with female terminals 40 of the connector 14. However, one or more of the pins may be provided as grounding pins 38a for the EMI protection layer. Only one of the pins 38a is shown. As may be seen, for these purposes, the terminal pins 38 and 38a need to pass through a wall of the container 16. All of the pins 38 are required as signal pins and thus it is necessary to electrically isolate these pins from the EMI protection layer 22. This electrical isolation is performed by providing each of the signal pins 38 with an electrical insulation layer 42 which extends along an axial length of each pin which will pass through the plane of the layer 24 with the pins inserted through the wall of the container. This insulation layer is formed by a molding or coating process and, in each case, must terminate short of the free end of the pin so that a free end portion of each pin, as shown in FIG. 4, is provided for electrical contact with the female terminals 40 of the connector 14.

As indicated above, the chamber 28 is hermetically sealed upon forming the closure of the chamber. Hence the container itself is non-apertured and non-porous. In view of the fact that hermetic sealing is required for the chamber 28, a positive seal must be provided around the region accommodated by the pins 38 so as to prevent ambient atmospheric moisture from passing along the pins and into the chamber 28. For this purpose, an endless seal is provided which encircles the plurality of electrical conductor pins 38. This seal may be provided by a suitable seal adhesive, but, in the case of the embodiment it is provided by an endless compressible sealing member 44 which is carried upon a surface 46 of an endless outwardly projecting flange 48 of the housing of the connector 32. As shown in the embodiment, the seal 44 is a flat compressible seal, but may be of other designs, e.g. a compressible ring possibly received in an appropriate retaining channel in the flange 48.

To hold the seal 44 positively in sealing engagement on a continuous basis against the outer surface of the container 16, two fastening devices are provided which hold the connectors 14 and 32 together. Any suitable fastening device design may be provided for this purpose, but in the case of the embodiment the fastening devices comprise two holding pins 50 spaced apart along the length of the connector 32. Only one holding pin 50 is shown in the drawings as these illustrate one enlarged end of the connector 32. Each holding pin is secured in position to the flange 48 as shown in FIG. 4, within the region bounded by the seal 44 and extending in the direction of the pins 38 and parallel thereto. Each pin 50 is received in another part of the fastening device, i.e. a pin receiving element 52 in an outwardly directed flange 54 of the connector 14. Each fastening device is basically of a known constructional type and each pin is frictionally or resiliently engaged within the pin receiving element 52 for the purposes of holding the two connectors together. The two connectors 14 and 32 are urged together by the fastening devices which also assist in holding the flange 48 towards the container 16 so as to maintain the seal 44 in compression.

As may be seen from the above construction, the assembly 10 is simple in design and is economic in manufacture and also it is easy to form the assembly (as will be discussed below). In addition, because of the method of assembling the printed circuit board and connector 14 within the container 16, then the connector 14 need only be as large as is necessary for electrical contact with circuitry on the board 12 and for conveying signals to and from the board. Hence, the connector 14 is of normal size for mounting upon a board and does not require to be of any greater size for the purpose of sealing it to the open end 18 of the container, this latter structure differing markedly from the present invention in the manner of conveying electrical signals from within the container.

Figure 7:
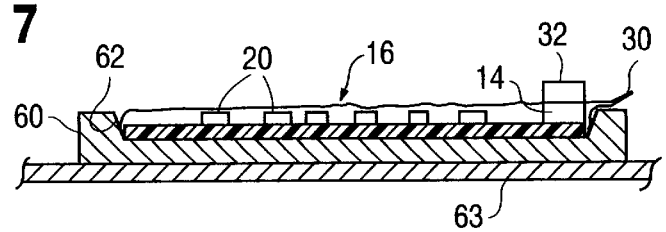
FIG. 7 is a cross-sectional view similar to FIG. 5 showing elements of the first embodiment at the further stage in the completion of the assembly of FIG. 6.
Figure 6:
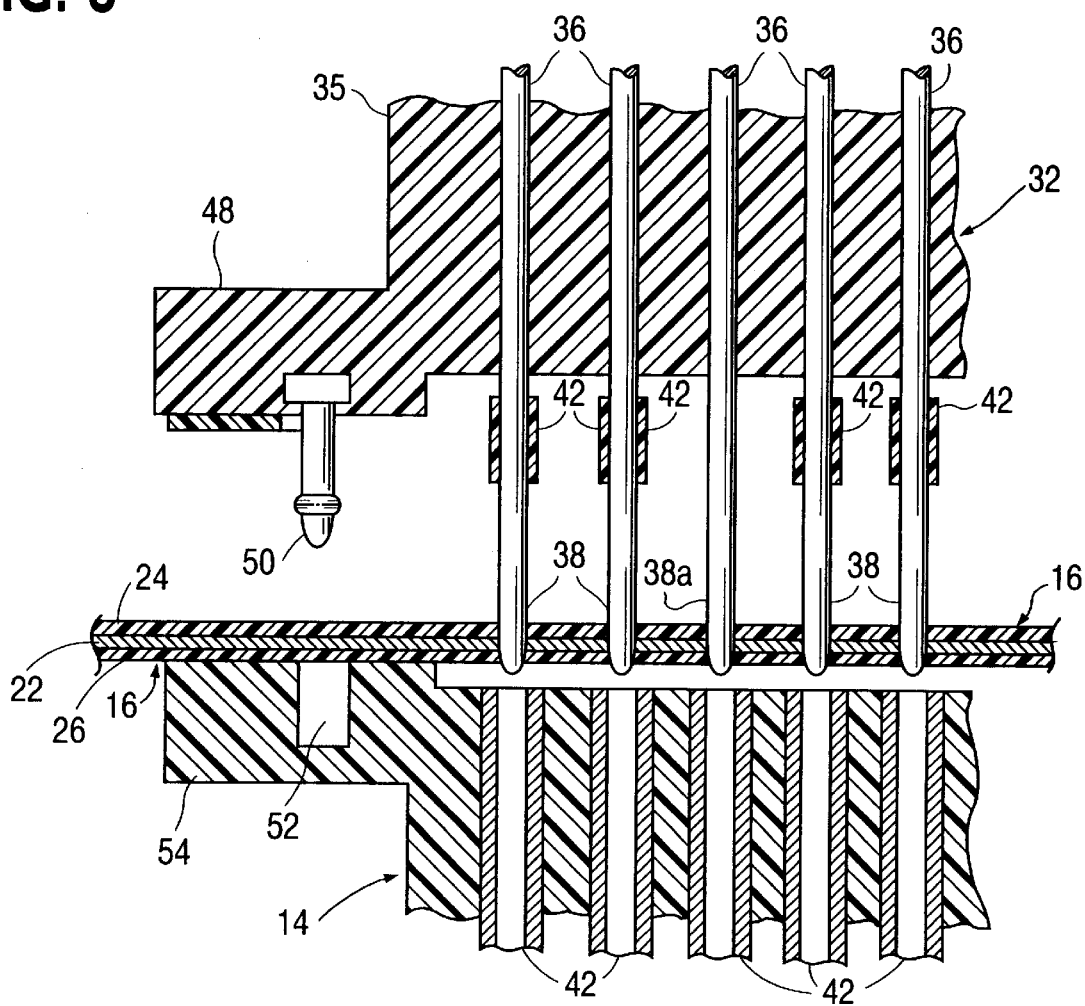
FIG. 6 is a large scale cross-sectional view similar to FIG. 4 and showing a further stage in the completion of the assembly in the first embodiment.

The process of forming the assembly 10 will now be described with reference to FIGS. 6 and 7.

Figure 5:
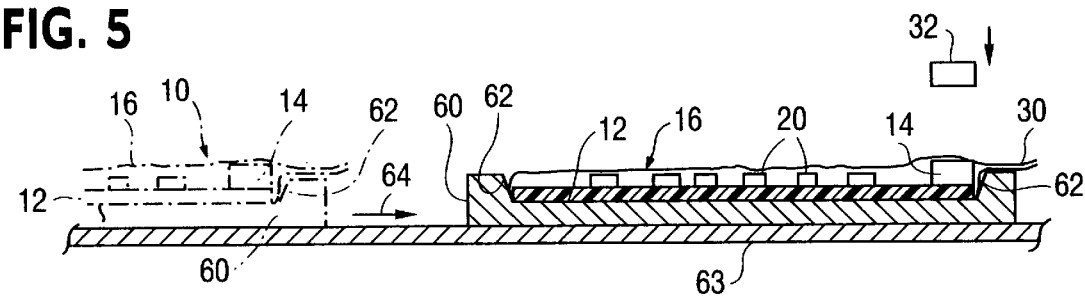
FIG. 5 is a cross-sectional view to the scale of FIG. 1 and showing the assembly stage of FIG. 4.
Figure 8:
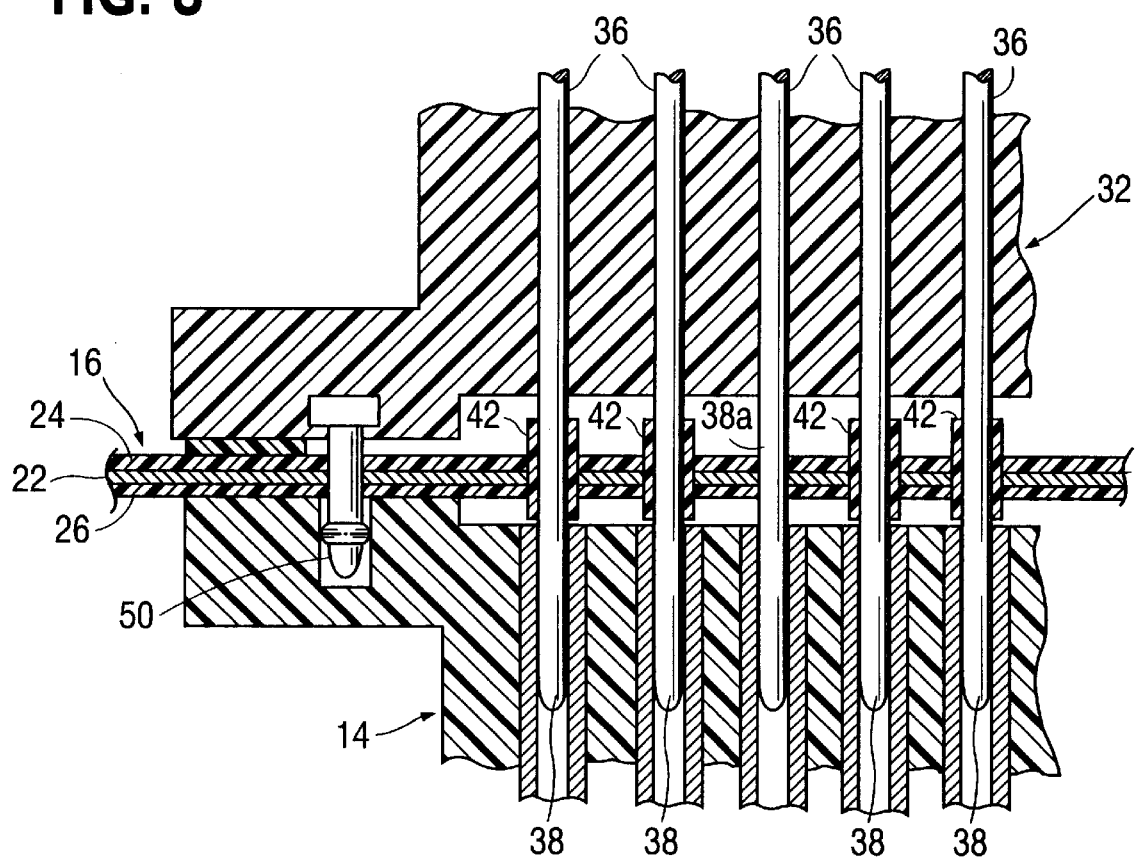
FIG. 8 is a view similar to FIG. 4 of the completed assembly of the first embodiment.

As shown by FIG. 5, a partial assembly comprising the sealed container 16 containing the sub-assembly of the printed circuit board 12 and connector 14 is located automatically upon a registration member 60 having inwardly facing and downwardly converging registration surfaces 62. The container containing the board and connector 14 has been lowered automatically between the surfaces 62 so that the printed circuit board 12 is substantially registered in position horizontally through the thickness of the container 16. This is the chaindotted position of FIG. 6. The registration member 60 is then moved upon a horizontal support 63 and in the direction of arrow 64 into the full outline position of FIG. 6 in an inline operation and in which it lies in a connector joining station in which the connector 32 is to be connected to the connector 14. In this position, the connector 32 is positioned vertically above the connector 14, as shown in full outline in FIG. 5 and to a larger scale in FIG. 4. With the registration member 60 held in this location, the connector 32 is moved downwardly with its pins 38 and 38a substantially aligned with the terminals 40 to the connector 14. As the connector 32 is moved downwards, the free ends of the pins 38 and 38a, which are normally slightly tapered, pierce through the wall of the container to form individual pierced holes (FIG. 6) before proceeding to the final connector position shown in FIGS. 7 and 8. In this position, as described above, the fastening devices urge the two connectors together and place the seal 44 in a compressed and sealing condition. Also in the final assembly, the insulation layers 42 provide an effective electric isolation between the pins 38 and the EMI protection layer 22. The pins 38a which are devoid of insulation layers intimately contact the EMI protection layer 22 in forcing their way through the wall of the container, possibly with gas-tight engagement. This provides an effective electrical grounding contact with the EMI protection layer.

As may seen from the assembly of the first embodiment as described above, and with regard to the method of making the assembly 10, an economic EMI protected printed circuit board and connector structure is provided.

This serves as a comparable and effective replacement for conventional assemblies of printed board and rigid EMI protection arrangements.

In addition to this, and as may be seen from FIGS. 1 to 8, the finished assembly construction is substantially no greater in size than is required for the board and for the connectors themselves. As a result, and as will be described below, a higher density of EMI protected printed circuit boards and their surface mount components is made possible than has previously been the case.

Figure 12:
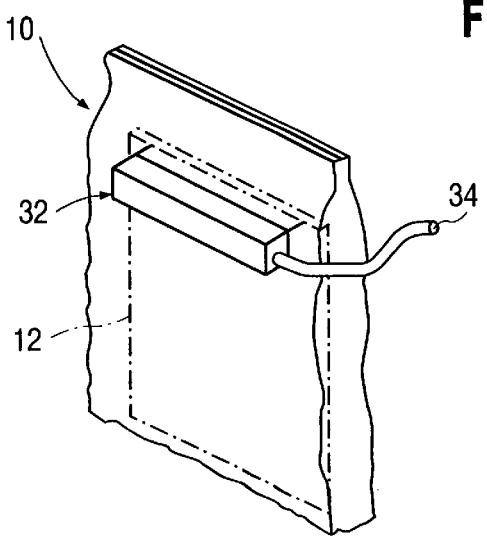
FIG. 12 is an isometric view of the finished assembly of the first embodiment.
Figure 9:
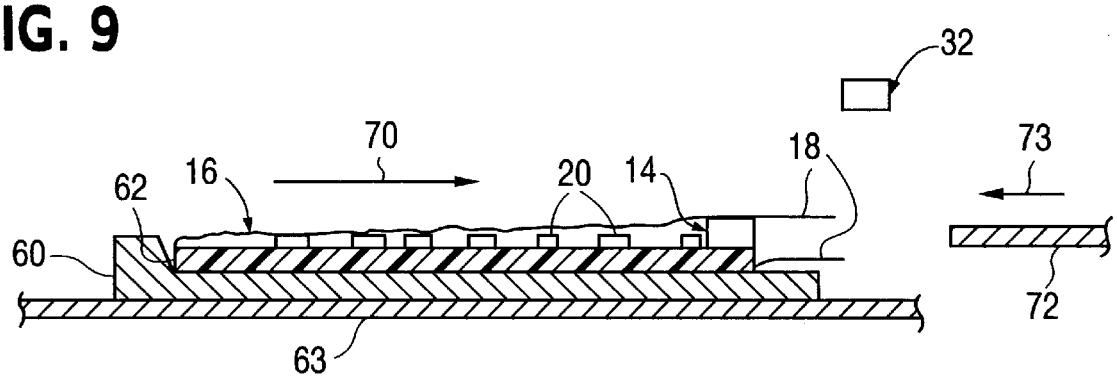
FIGS. 9, 10 and 11 are cross-sectional views showing three consecutive stages in the forming of the assembly of the first embodiment and as an alternative to the method of FIGS. 4 to 7.
Figure 10:
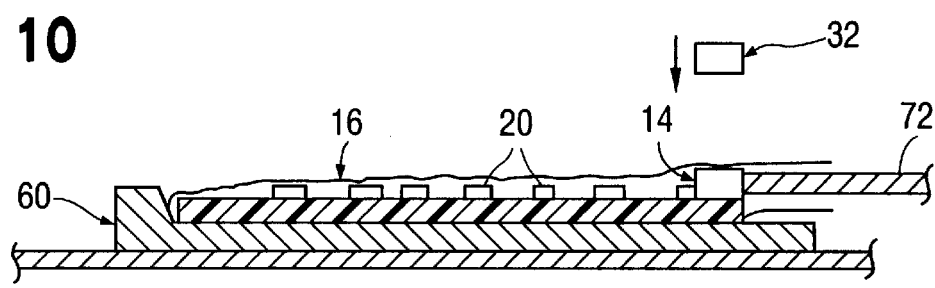
Figure 11:
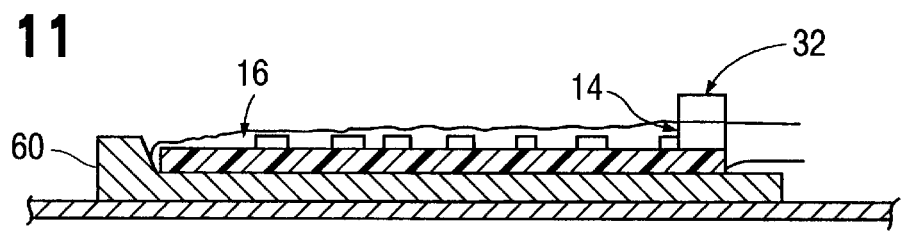

In a modification of the method of making the assembly 10 described above, the assembly is formed with the container 16 in an open condition as distinct from in the sealed closed condition as described above. In the modification as shown by FIG. 9, the printed circuit board 12 carrying the connector 14 is urged, in an inline process, in the direction of arrow 70 towards a registration member 72 which may also be moving in the direction of arrow 73 into a registration position. The registration member 72 enters the open end 18 in the container 16 (FIG. 10) to engage an end surface of the connector 14 (or of the printed circuit board 12) for the purpose of registering the assembly of printed circuit board and connector in the connector joining station. As shown by FIGS. 10 and 11, the connector 32 is moved downwardly as in the previously described process to make engagement with the connector 14. The container is then sealed to result in the assembly 10 shown in FIG. 1. An isometric view of the assembly 10 in a vertical position is shown by FIG. 12.

In a further modification (not shown) of the first embodiment described above, the container 16 may be preformed with a single large hole (not shown) of a size to allow for passage therethrough of all of the conductors 38 into electrical connection with the connector 14. As will be appreciated, however, the formation of a pre-formed hole requires a further manufacturing step to that required in the first embodiment and also demands that the large pre-formed hole must be accurately placed for alignment between the two connectors.

Figure 13:
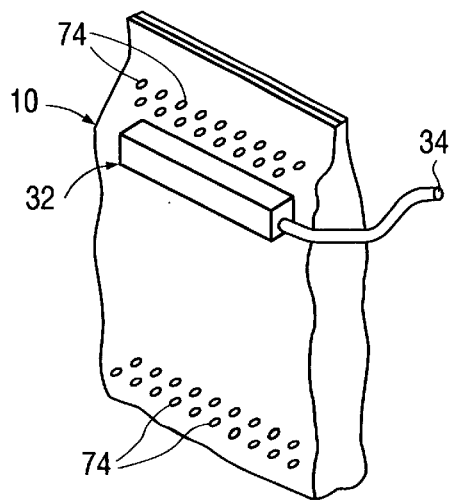
FIG. 13 is a view similar to FIG. 12 of a modification of the first embodiment.

In yet a further modification of the first embodiment and as shown by FIG. 13 in which the references used in the first embodiment are repeated for similar features, the container 16 is provided with perforations 74 at upper and lower end regions for the purpose of the passage therethrough of cooling air by convection if the assembly 10 is mounted in the vertical position shown in FIG. 13. In this case, the perforations 74 are of spacing and size which are consistent with substantially preventing EMI radiation through the container.

Figure 14:
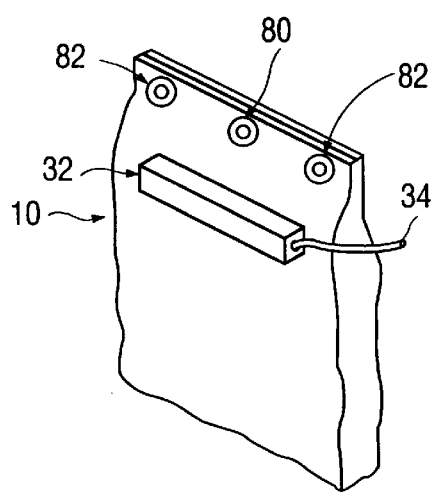
FIG. 14 is a view similar to FIG. 12 and showing mounting positions for the assembly of the first embodiment.

It is convenient to mount the assembly 10 with the plane of the printed circuit board 12 extending vertically. For this purpose the container may be hung at a top end region, which is conveniently the sealed marginal edge regions 30. In the embodiment, to enable the container to be hung in this position it may be provided with a single mounting means 80 (FIG. 14) conveniently positioned centrally of the marginal edge regions 30 or two or more spaced apart apertures 82. In the case of two apertures 82, it is convenient to position these in corner regions of the marginal edge regions 30 of the container.

Figure 15:
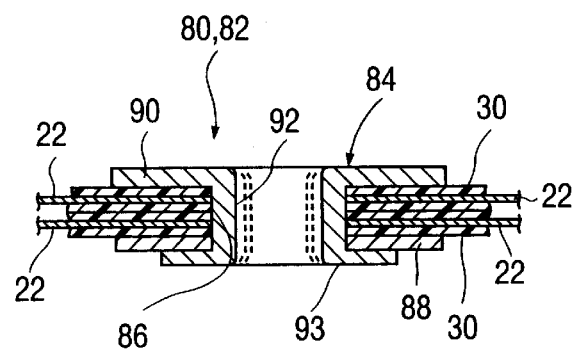
FIG. 15 is a cross-sectional view through part of the structure of FIG. 14 and to a larger scale.
Figure 15A:
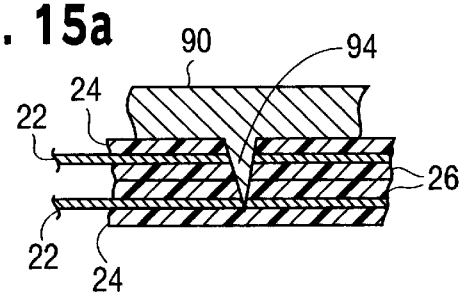
FIG. 15a is a cross-sectional view, and to a much larger scale, of part of the structure of FIG. 15.

As shown by FIG. 15, each mounting means 80 or 82 comprises a metal ferrule construction 84 which is fastened on to the sealed regions 30 of the container with part of the ferrule construction passing through a pre-formed hole 86 in the container. It is intended that each of the ferrule constructions is disposed in an area which is sealed from the chamber 28 so as to maintain the chamber hermetically sealed. Each ferrule construction 84 comprises a planar annular disc 88 which engages one outer surface of the container while lying concentric with the hole 86. On the other outer surface, the ferrule construction comprises a disc 90 having a central axially extending flange 92 which extends through the hole 86, the flange 92 being pressed around the annular disc 88 to provide a short annular disc 93 to hold the assembly of discs in position. In addition to this, the disc 90 may be formed with spaced teeth 94 (FIG. 15a) positioned outwardly from the flange 92 and extending in the same direction, these teeth passing into the container as shown in FIG. 15a into contact with EMI protection layer 22 in the assembled condition of the ferrule. The teeth, therefore, are in electrical contact with layer 22 for grounding purposes when located upon a carrier as will be discussed.

Figure 16:
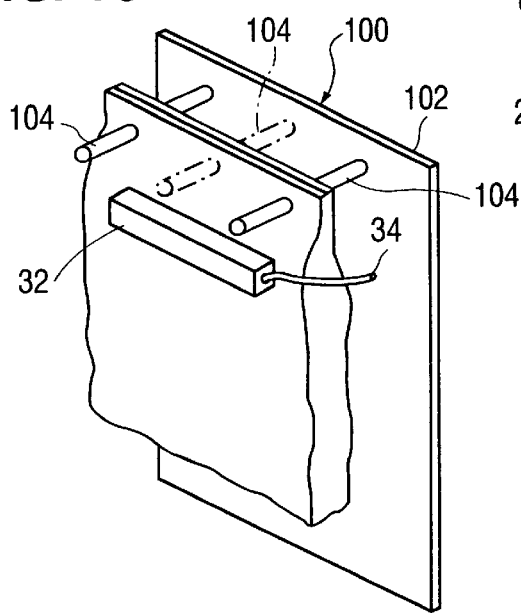
FIG. 16 is a view similar to FIG. 14 and showing the assembly of FIG. 14 carried upon a mounting.

As shown in FIG. 16, a carrier 100 is provided for holding the assembly 10 in a vertical position. This carrier 100 comprises a fixed grounded back plate 102. In the case where there is a single mounting means 80 in the container 16, a single mounting shaft 104 (chaindot in FIG. 16) is provided extending from the back plate 102. Where however, as is preferred, there are two mounting means 82 provided then two parallel spaced apart shafts 104 extend from the back plate (full outline in FIG. 16). FIG. 16 shows the assembly 10 mounted on to the carrier 100 with the reception of two shafts 104 through the mounting means 82. The diameter of the shafts 104 may be such as to be frictionally gripped by the flanges 92 so as to provide a grounding for the EMI protection layer 22 through the ferrule construction 84. The assembly 10 mounted upon the carrier 100 may be contained within a housing (not shown).

Figure 17:
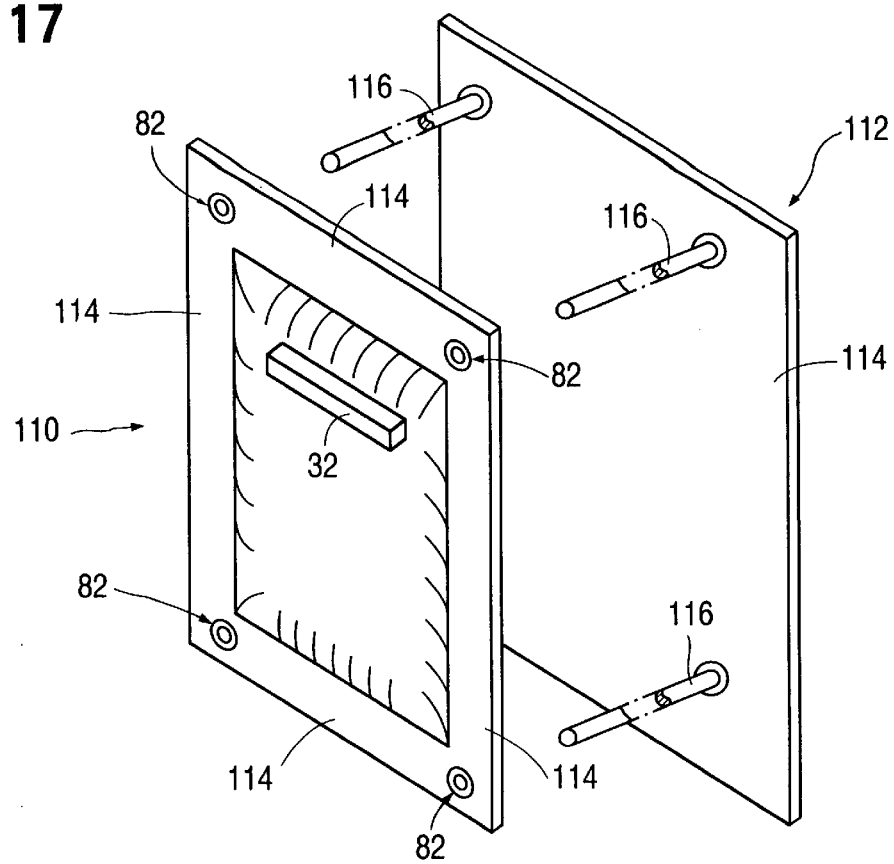
FIG. 17 is an exploded isometric view of an assembly of printed circuit board and flexible container and a mounting according to a second embodiment.
Figure 18:
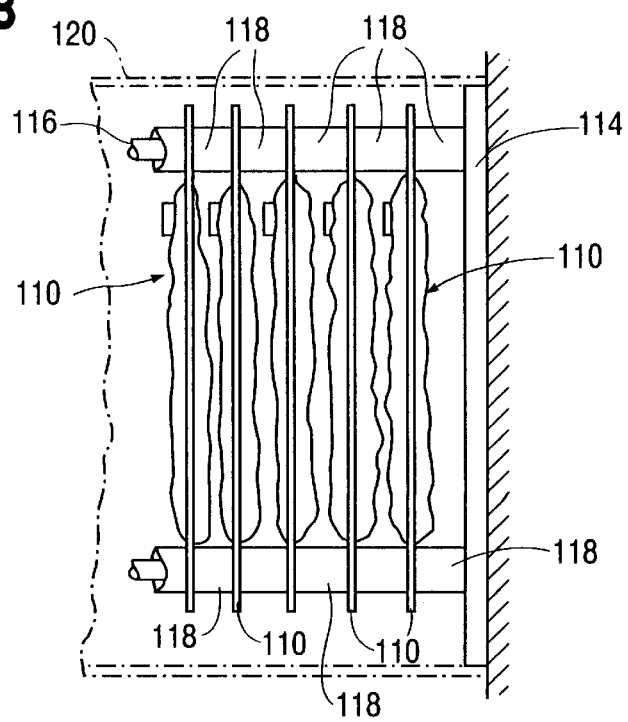
FIG. 18 is a side-elevational view of a plurality of assemblies according to the second embodiment carried upon a mounting.

In FIGS. 17 and 18 there is shown an assembly 110 of printed circuit board and container according to a second embodiment together with a carrier 112.

The assembly 110 is basically of the construction of the first embodiment except, in the case of the assembly 110, there is a sealed seam 114 extending completely around the chamber of the container, i.e. in the surrounding marginal regions. As in the first embodiment, an exterior connector 32 is disposed in sealed contact with the outside surface of the container and is connected into a connector 14 (not shown in FIGS. 17 and 18) as described in the first embodiment. In the case of the second embodiment there are two mounting means 82 provided in top corner regions of the container and two other mounting means 82 are also provided in the bottom corner regions as shown. Each of these mounting means is located in the sealed seam so as to maintain the chamber within the closure in a hermetically sealed condition.

The carrier 112 for the assembly 110 comprises a fixed grounded back plate 114 having four horizontally extending mounting shafts 116 extending from it. One shaft 116 is obscured by the assembly 110. The shafts 116 are relatively positioned to be accepted one through each of the mounting means 82 for mounting the assembly 110 on the mounting means. As may be seen from FIG. 18, a plurality of the assemblies 110 may be mounted in vertical side by side relationship upon the horizontal shafts 116 which are made sufficiently long to accommodate them. As also shown from FIG. 17, the assemblies 110 are spaced apart, if required, by spacer sleeves 118 which are positioned between the assemblies 110 upon the shafts 116. Hence, a plurality of circuit boards are mounted in side by side relationship, each provided with its own EMI protection. The space required for such an arrangement is extremely small and the arrangement is economic to produce. If required, an outer cover 120 of metal or plastic may be provided, shown in chaindotted in FIG. 17, the cover being assembled onto the carrier.

What is claimed is:

1. An assembly of a printed circuit board and a flexible container comprising:
    a printed circuit board having a first electrical connector electrically connected thereto;
    a flexible container defining a chamber within the container, the chamber containing both the printed circuit board and the first electrical connector, the flexible container having a laminate construction wall and comprising a dielectric layer facing inwardly into the chamber and an EMI protection layer surrounding the dielectric layer; and
    a second electrical connector mounted exteriorly of and upon a wall of the container, one of the connectors having electrical conductor terminal pins which extend through individual holes in the wall of the container and electrically connect the first and second connectors together with at least selected ones of the conductor pins being signal pins which are electrically isolated from the EMI protection layer.

2. An assembly according to claim 1 wherein each conductor terminal passes through a respective one of the individual holes in the container formed by the passing of the pin through the wall.

3. An assembly according to claim 1 wherein the laminate wall construction comprises at least three layers and includes a further dielectric layer surrounding the EMI protection layer.

4. An assembly according to claim 3 wherein the further dielectric layer has characteristics of abrasion and cutting resistance and provides structural strength to the container.

5. An assembly according to claim 1 wherein the electrical conductor terminal pins are provided by the second connector and the pins pass inwardly through the container and into electrical contact with terminal sockets provided by the first connector.

6. An assembly according to claim 1 wherein each of the signal pins is electrically isolated from the EMI protection layer by an individual dielectric layer surrounding the signal pin and separating the signal pin from the EMI protection layer.

7. An assembly according to claim 1 including a fastening device which holds the first and second connectors assembled together.

8. An assembly according to claim 7 wherein the fastening device comprises a plurality of holding pins extending from one connector to the other connector, the holding pins being resiliently engageable within and disengageable from a pin mating member of the other connector.

9. An assembly according to claim 1 wherein the wall of the container is formed with a plurality of spaced apart apertures provided for cooling air circulation into and out of the chamber, the spacing and sizes of the apertures being consistent with substantially preventing EMI radiation through the container.

10. An assembly according to claim 1 wherein the chamber is hermetically sealed within the container and the second electrical connector is sealed against the container by an endless seal which encircles the plurality of electrical conductors.

11. An assembly according to claim 10 wherein the container has a heat sealed opening in which the seal of the opening is provided by fused confronting portions of the dielectric layer which faces inwardly into the chamber, the confronting portions provided by marginal parts of the container which define the opening.

12. An assembly according to claim 10 including a fastening device which holds the first and second connectors assembled together causes the container to be gripped between the first and second connectors and urges the second connector towards the container to maintain the second connector sealed against the container.

13. An assembly according to claim 12 wherein the endless seal comprises an endless sealing member carried by the second connector.

14. An assembly according to claim 1 wherein the flexible container has at least one mounting means extending through the container in a marginal region of the container laterally of the printed circuit board.

15. An assembly according to claim 10 wherein the flexible container has at least one mounting means extending through the container in a marginal region of the container laterally of the printed circuit board and hermetically sealed from the chamber.

16. An assembly according to claim 15 wherein the mounting means comprises a conductive material which defines a periphery to an aperture in the container, the conductive material electrically connected to the EMI protection layer.

17. A method of forming an assembly of a printed circuit board and a flexible container comprising:
    providing a sub-assembly of a printed circuit board with a first electrical connector mounted thereon passing the sub-assembly through an opening in a flexible container to contain the sub-assembly wholly within a chamber defined by the flexible container, the opening in the container being subsequently closed, and the flexible container having a laminate construction wall comprising a dielectric layer facing inwardly into the chamber and an EMI protection layer surrounding the dielectric layer;
    providing a second electrical connector exteriorly of the container and relatively positioning the sub-assembly and the second connector to locate electrical terminals of the second connector aligned with electrical terminals of the first connector; and
    electrically connecting together the two connectors by passing electrical conductor terminal pins of one of the connectors through individual holes in the wall of the container and into electrical contact with terminal sockets of the other connector with at least selected ones of the terminal pins being signal pins which, during electrically connecting the two connectors together, are electrically isolated from the EMI protection layer.

18. A method according to claim 17 comprising closing of the opening in the container prior to connecting together the two connectors.

19. A method according to claim 17 comprising closing the opening in the container subsequent to connecting together the two connectors.

20. A method according to claim 17 comprising electrically connecting together the two connectors with the opening closed by registering sides of the printed circuit board through a wall of the container with registration surfaces to locate the printed circuit board and first connector in a predetermined position, and then, with the second connector in another predetermined position and with electrical terminals of the two connectors aligned, moving the connectors relatively towards each other to electrically connect them together.

21. A method according to claim 17 comprising electrically connecting together the two connectors with the opening in the open position by engaging the sub-assembly of the printed circuit board and the first connector with a registration surface extending through the opening and into the chamber to locate the sub-assembly in a predetermined position, and then, with the second connector in another predetermined position and with electrical terminals of the connectors aligned, moving the connectors relatively towards each other to electrically connect them together, and then closing the opening.

22. A method according to claim 17 wherein the container is non-porous and is non-perforate, the method comprising sealing the second connector against the container and hermetically sealing the chamber within the container.

23. A method according to claim 22 comprising urging together and fastening together the first and second connectors to grip the container between them and to maintain the second connector sealed against the container.

24. A method according to claim 17 comprising passing the electrical conductor terminal pins through the wall of the container by forcing the pins against the wall of the container to form individual holes the for the pins in the wall and then causing the pins to project through the individual holes.

25. A method according to claim 24 wherein the electrical conductor terminal pins are provided by the second connector and the pins are forced against an outside surface of the wall of the container to form the individual holes, and the pins are caused to project through the holes to electrically connect the connectors together.

26. In combination, an assembly of a printed circuit board, a flexible container for the printed circuit board, and a carrier for the assembly, wherein the combination comprises:

printed circuit board having a first electrical connector electrically connected thereto;

a flexible container defining a chamber within the container, the chamber containing both the printed circuit board and the first electrical connector, the flexible container having a laminate construction wall and comprising a dielectric layer facing inwardly into the chamber and an EMI protection layer surrounding the dielectric layer;

a second electrical connector mounted exteriorly of and upon a wall of the container, one of the connectors having electrical conductor terminal pins which extend through the wall of the container to electrically connect the first and second connectors together with at least selected ones of the conductor terminal pins being signal pins which are electrically isolated from the EMI protection layer, the container also being provided with at least one mounting means extending through the container in a marginal region of the container laterally of the printed circuit board; and the carrier comprises a mounting member having a mounting shaft extending from the mounting member, the mounting shaft being capable of being passed through an aperture of the mounting means to mount the assembly upon the carrier.

27. A combination according to claim 26 wherein the chamber is hermetically sealed within the container, the second electrical connector is sealed against the container by an endless seal which encircles the plurality of electrical conductors, and the at least one mounting means extends through the container in a marginal region of the container laterally of the printed circuit board and is hermetically sealed from the chamber.

28. A combination according to claim 27 wherein the mounting means comprises a conductive material which defines a periphery to an aperture in the container, the conductive material being electrically connected to the EMI protection layer, and the mounting shaft is electrically conductive and is in conductive engagement with the conductive material to provide a ground for the EMI protection layer.

29. A combination according to claim 26 wherein the flexible container has a plurality of apertured mounting means in spaced positions around the printed circuit board and the carrier has a plurality of parallel mounting shafts relatively positioned to be simultaneously receivable each through an aperture of an individual mounting means.

30. A combination according to claim 26 comprising at least one further assembly of printed circuit board and flexible container containing the printed circuit board, and a spacer is provided for reception upon the mounting shaft, the mounting shaft being of sufficient axial length to be received through the apertured mounting means of the containers of the assemblies with the spacer located on the pin and between the containers of the assemblies.

31. A combination according to claim 26 further including a housing defining a mounting chamber for the assembly.

32. An electrical connector comprising:

a dielectric housing; and a plurality of electrical conductor terminals carried by the housing, the plurality of terminals comprising electrical conductor terminal pins extending from the housing, and only some of the pins having an electrical insulation layer extending around an axial length of each pin with a free end portion of the pin extending outwardly beyond its insulation layer.

* * * * *